(12) United States Patent
Liu

(10) Patent No.: US 11,813,641 B2
(45) Date of Patent: Nov. 14, 2023

(54) ACOUSTIC TRANSDUCTION UNIT, MANUFACTURING METHOD THEREOF AND ACOUSTIC TRANSDUCER

(71) Applicant: BOE TECHNOLOGY GROUP CO., LTD., Beijing (CN)

(72) Inventor: Xiaotong Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 245 days.

(21) Appl. No.: 17/332,726

(22) Filed: May 27, 2021

(65) Prior Publication Data

US 2022/0097099 A1  Mar. 31, 2022

(30) Foreign Application Priority Data

Sep. 28, 2020 (CN) .......................... 202011039694.1

(51) Int. Cl.
*B06B 1/06* (2006.01)
*H10N 30/06* (2023.01)
*H10N 30/87* (2023.01)

(52) U.S. Cl.
CPC ........... *B06B 1/0666* (2013.01); *H10N 30/06* (2023.02); *H10N 30/87* (2023.02)

(58) Field of Classification Search
CPC .......... B06B 1/0666; B06B 1/06; H10N 30/87
USPC .................................. 310/322, 328, 334, 348
See application file for complete search history.

(56) References Cited

U.S. PATENT DOCUMENTS

| 2011/0260576 A1 | 10/2011 | Masaki et al. |
| 2015/0366539 A1 | 12/2015 | Hasegawa |
| 2023/0006126 A1* | 1/2023 | Tanaka ................. H10N 30/506 |

FOREIGN PATENT DOCUMENTS

| CN | 102728535 A | 10/2012 |
| CN | 104219598 A | 12/2014 |
| CN | 204377110 U | 6/2015 |
| CN | 105025423 A | 11/2015 |

(Continued)

OTHER PUBLICATIONS

China Patent Office, First Office Action (OA1) regarding CN202011039694.1 dated May 28, 2021.

(Continued)

*Primary Examiner* — Derek J Rosenau
(74) *Attorney, Agent, or Firm* — HOUTTEMAN LAW LLC

(57) ABSTRACT

The present disclosure provides an acoustic transduction unit, a manufacturing method thereof and an acoustic transducer. The acoustic transduction unit includes a substrate, and a first electrode, a vibrating film and a second electrode sequentially arranged on the substrate, a cavity is formed between the first electrode and the vibrating film, orthographic projections of the first electrode, the cavity, the vibrating film and the second electrode on the substrate are at least partially overlapped with each other at a first overlapping region, and a hollowed-out pattern is formed in the vibrating film, and the orthographic projection of the hollowed-out pattern on the substrate and the orthographic projection of the cavity on the substrate are overlapped with each other, and the orthographic projection of the hollowed-out pattern on the substrate is distributed in a discontinuous manner around the first overlapping region.

19 Claims, 10 Drawing Sheets

(56) References Cited

FOREIGN PATENT DOCUMENTS

| CN | 105264369 A | 1/2016 |
|----|-------------|--------|
| CN | 106783894 A | 5/2017 |
| CN | 107071672 A | 8/2017 |
| CN | 208657071 U | 3/2019 |
| CN | 110560350 A | 12/2019 |
| CN | 111377389 A | 7/2020 |
| KR | 20160015348 A | 2/2016 |

OTHER PUBLICATIONS

China Patent Office, CN202011039694.1 Second Office Action (OA2) dated Nov. 16, 2021.

\* cited by examiner

ACOUSTIC TRANSDUCTION UNIT, MANUFACTURING METHOD THEREOF AND ACOUSTIC TRANSDUCER

CROSS-REFERENCE TO RELATED APPLICATIONS

This present application claims the priority of the Chinese Patent Application with the Application No. 202011039694.1 filed on Sep. 28, 2020, which is incorporated herein in its entirety by reference.

TECHNICAL FIELD

The present disclosure relates to the field of ultrasonic sensor technology, and in particular to an acoustic transduction unit, a manufacturing method thereof and an acoustic transducer.

BACKGROUND

A Capacitive Micro-machined Ultrasonic Transducer (CMUT) is a transducer that converts an ultrasonic signal into other kind of energy signal (typically an electrical signal). Ultrasonic waves are mechanical waves with a vibration frequency higher than 20 kHz. It has the characteristics of high frequency, short wavelength, small diffraction phenomenon, good directivity, directional propagation as rays and the like, and is widely used in the fields of industry, national defense, biomedicine and the like.

At present, an ultrasonic sensor has the defect of low sound pressure, and how to improve the emission sound pressure is a key problem of research.

SUMMARY

The present disclosure provides an acoustic transduction unit, including: a substrate, a first electrode, a vibrating film and a second electrode sequentially arranged on the substrate, and a cavity formed between the first electrode and the vibrating film, wherein orthographic projections of the first electrode, the cavity, the vibrating film and the second electrode on the substrate are at least partially overlapped with each other at a first overlapping region, and a hollowed-out pattern is formed in the vibrating film, and an orthographic projection of the hollowed-out pattern on the substrate and the orthographic projection of the cavity on the substrate are overlapped with each other and the hollowed-out pattern is distributed in a discontinuous manner around the first overlapping region.

In some embodiments, the hollowed-out pattern includes a central symmetric pattern, and an orthographic projection of a symmetry center of the central symmetric pattern on the substrate coincides with a center of the first overlapping region.

In some embodiments, the hollowed-out pattern includes a plurality of sub-portions, orthographic projections of which on the substrate are uniformly arranged around the center of the first overlapping region; the plurality of sub-portions include even number of sub-portions, two opposite sub-portions of which are symmetrically arranged by taking the center of the first overlapping region as a symmetrical center, and the plurality of sub-portions each include any one of a polygon, an arc, an arc and a rectangle arranged at intervals, and a non-closed arc combined with a rectangular strip and/or a rectangular block.

In some embodiments, the cavity includes a cavity body, and an orthographic projection of the cavity body on the substrate has a shape which includes any one of a rectangle, a circle, and a regular polygon.

In some embodiments, the cavity further includes a plurality of cavity sub-bodies, the plurality of cavity sub-bodies are arranged at intervals at a periphery of the cavity body, and the cavity sub-bodies are communicated with the cavity body; and the orthographic projection of the hollowed-out pattern on the substrate falls into the orthographic projection of the cavity on the substrate; and the orthographic projection of the hollowed-out pattern on the substrate is not overlapped with the orthographic projection of the second electrode on the substrate.

In some embodiments, the acoustic transduction unit further includes a corrosion barrier layer and a passivation layer, wherein the corrosion barrier layer is disposed on a side of the first electrode proximal to the vibrating film, and an orthographic projection of the corrosion barrier layer on the substrate covers the orthographic projection of the first electrode on the substrate; and the passivation layer is arranged on a side of the second electrode distal to the vibrating film, and an orthographic projection of the passivation layer on the substrate at least covers the orthographic projection of the second electrode on the substrate.

In some embodiments, the orthographic projection of the passivation layer on the substrate and the orthographic projection of the hollowed-out pattern on the substrate are not overlapped with each other.

In some embodiments, the orthographic projection of the passivation layer on the substrate covers the orthographic projection of the cavity on the substrate; and at least one through hole is formed in the passivation layer, and an orthographic projection of the at least one through hole on the substrate falls into the orthographic projection of the hollowed-out pattern on the substrate.

In some embodiments, the at least one through hole is filled with a hole filling material.

In some embodiments, the first electrode and the second electrode are made of any one of molybdenum, aluminum, copper and gold; the vibrating film is made of silicon nitride and/or silicon oxide; a shape of the vibrating film includes any one of a rectangle, a circle and a regular polygon; a shape of the first electrode includes any one of a rectangle, a circle and a regular polygon; and a shape of the second electrode includes any one of a rectangle, a circle, and a regular polygon.

The present disclosure further provides an acoustic transducer, including at least one acoustic transduction unit as above.

The present disclosure further provides a method for manufacturing an acoustic transduction unit, including: forming a first electrode on a substrate; and sequentially forming a vibrating film and a second electrode on the first electrode such that a cavity is formed between the vibrating film and the first electrode, and the orthographic projections of the first electrode, the cavity, the vibrating film and the second electrode on the substrate are at least partially overlapped with each other at a first overlapping region, a hollowed-out pattern is formed in the vibrating film, and orthographic projections of the hollowed-out pattern and the cavity on the substrate are overlapped with each other, and the hollowed-out pattern is distributed in a discontinuous manner around the first overlapping region.

In some embodiment, the sequentially forming a vibrating film and a second electrode on the first electrode includes: forming a pattern of a corrosion barrier layer on the first electrode; forming a pattern of a sacrificial layer on the corrosion barrier layer; forming the vibrating film on the sacrificial layer; forming a pattern of the second electrode on the vibrating film; forming a pattern of a passivation layer on the second electrode; and patterning the vibrating film such that the hollowed-out pattern is formed in the vibrating film; then removing the sacrificial layer via the hollowed-out pattern to form the cavity such that the orthographic projection of the passivation layer on the substrate is not overlapped with the orthographic projection of the hollowed-out pattern on the substrate.

In some embodiments, the sequentially forming a vibrating film and a second electrode on the first electrode includes: forming a pattern of a corrosion barrier layer on the first electrode; forming a pattern of a first sacrificial layer on the corrosion barrier layer; forming a vibrating film on the first sacrificial layer, and patterning the vibrating film such that a pattern of the hollowed-out pattern is formed in the vibrating film; forming a pattern of a second sacrificial layer in the hollowed-out pattern of the vibrating film such that the second sacrificial layer is filled in the hollowed-out pattern; forming a pattern of the second electrode on the vibrating film; forming a pattern of a passivation layer on the second electrode; forming at least one through hole in the passivation layer such that an orthographic projection of the at least one through hole on the substrate falls into the orthographic projection of the hollowed-out pattern on the substrate; removing the first sacrificial layer and the second sacrificial layer via the at least one through hole to form the cavity and the hollowed-out pattern such that an orthographic projection of the passivation layer on the substrate covers an orthographic projection of the cavity on the substrate; and filling the at least one through hole with a hole filling material.

In some embodiments, the hollowed-out pattern includes a central symmetric pattern, and an orthographic projection of a symmetry center of the central symmetric pattern on the substrate coincides with a center of the first overlapping region.

In some embodiments, the hollowed-out pattern includes a plurality of sub-portions, orthographic projections of which on the substrate are uniformly arranged around the center of the first overlapping region; the plurality of sub-portions include even number of sub-portions, two opposite sub-portions of which are symmetrically arranged by taking the center of the first overlapping region as a symmetrical center, and the plurality of sub-portions each include any one of a polygon, an arc, an arc and a rectangle arranged at intervals, and a non-closed arc combined with a rectangular strip and/or a rectangular block.

In some embodiments, the cavity includes a cavity body, and an orthographic projection of the cavity body on the substrate has a shape which includes any one of a rectangle, a circle, and a regular polygon.

In some embodiments, the cavity further includes a plurality of cavity sub-bodies, the plurality of cavity sub-bodies are arranged at intervals at a periphery of the cavity body, and the cavity sub-bodies are communicated with the cavity body; and the orthographic projection of the hollowed-out pattern on the substrate falls into the orthographic projection of the cavity on the substrate; and the orthographic projection of the hollowed-out pattern on the substrate is not overlapped with the orthographic projection of the second electrode on the substrate.

In some embodiments, the first electrode and the second electrode are made of any one of molybdenum, aluminum, copper and gold; the vibrating film is made of silicon nitride and/or silicon oxide; a shape of the vibrating film includes any one of a rectangle, a circle and a regular polygon; a shape of the first electrode includes any one of a rectangle, a circle and a regular polygon; and a shape of the second electrode includes any one of a rectangle, a circle, and a regular polygon.

DETAILED DESCRIPTION

In order to make the technical solutions of the present disclosure better understood by a person skilled in the art, an acoustic transduction unit, a manufacturing method thereof, and an acoustic transducer of the present disclosure are described in further detail below with reference to the accompanying drawings and the detailed description.

Figure 1:
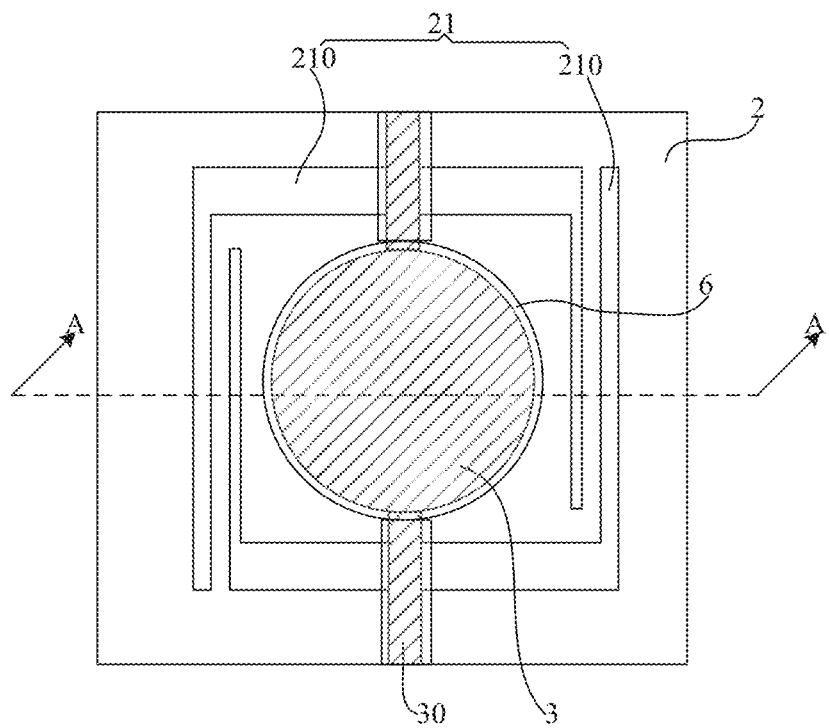
FIG. 1 is a schematic top view of a structure of an acoustic transduction unit according to an embodiment of the present disclosure.
Figure 2:
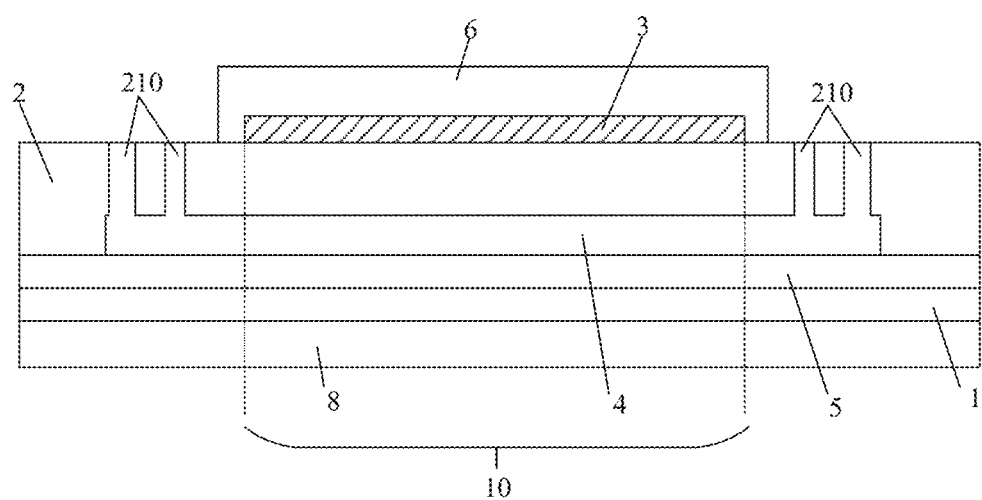
FIG. 2 is a schematic cross-sectional view of the structure of the acoustic transduction unit of FIG. 1 taken along a section line AA.

An embodiment of the present disclosure provides an acoustic transduction unit, as shown in FIG. 1 and FIG. 2, including a substrate 8, and a first electrode 1, a vibrating film 2, and a second electrode 3 that are sequentially disposed on the substrate 8, a cavity 4 is formed between the first electrode 1 and the vibrating film 2, orthographic projections of the first electrode 1, the cavity 4, the vibrating film 2 and the second electrode 3 on the substrate 8 are at least partially overlapped with each other at a first overlapping region 10, a hollowed-out pattern 21 is formed in the vibrating film 2, and an orthographic projection of the hollowed-out pattern 21 and the orthographic projection of the cavity 4 on the substrate 8 are overlapped with each other and the hollowed-out pattern 21 is distributed in a discontinuous manner around the first overlapping region 10.

As an example, the orthographic projection of the cavity 4 on the substrate 8 falls into the orthographic projection of the first electrode 1 on the substrate 8, the orthographic projection of the second electrode 3 on the substrate 8 falls into the orthographic projection of the cavity 4 on the substrate 8, the vibrating film 2 is provided with the hollowed-out pattern 21, and the orthographic projection of the hollowed-out pattern 21 on the substrate 8 falls into the orthographic projection of the cavity 4 on the substrate 8, and the hollowed-out pattern 21 is distributed in a discontinuous manner around the first overlapping region 10; the orthographic projection of the hollowed-out pattern 21 on the substrate 8 is not overlapped with the orthographic projection of the second electrode 3 on the substrate 8.

The "distributed in a discontinuous manner around the first overlapping region" refers to the hollowed-out pattern 21 having at least two discrete portions. That is, the hollowed-out pattern 21 cannot form a continuous distribution region. Since the cavity 4 is disposed below the hollowed-out pattern 21 in the vibrating film 2, the hollowed-out pattern 21 could not be continuously distributed, and if the hollowed-out pattern is continuously distributed, no film is disposed below the non-hollowed-out pattern of the vibrating film 2 except the hollowed-out pattern 21 corresponding to the cavity 4. The hollowed-out pattern 21 is formed by forming holes in the vibrating film 2 to make the holes penetrate through the vibrating film 2, so that the vibrating film 2 is provided with the hollowed-out pattern.

The substrate 8 is covered by the first electrode 1 and is disposed on a side of the first electrode 1 distal to the vibrating film 2, so as to protect an exposed surface of the first electrode 1.

As an example of the present disclosure, an orthographic projection of the hollowed-out pattern 21 on the substrate 8 falls in an orthographic projection of the cavity 4 on the substrate 8; so as to enable the vibrating film 2 to fully vibrate under an electric field or a magnetic field formed between the first electrode 1 and the second electrode 3 and further increase a vibration displacement of vibrating film 2, and then promote the emission sound pressure of the acoustic transduction unit. The orthographic projection of the hollowed-out pattern 21 on the substrate 8 is not overlapped with the orthographic projection of the second electrode 3 on the substrate 8; with this arrangement, on one hand, the cavity 4 is easily formed via the hollowed-out pattern 21, a sacrificial layer is formed before the hollowed-out pattern 21 is formed, and after the hollowed-out pattern 21 is formed and the sacrificial layer is released via the hollowed-out pattern 21, the cavity 4 is formed; on the other hand, the second electrode 3 is prevented from being corroded and damaged when the cavity 4 is formed; if the sacrificial layer is made of a metal material, when the sacrificial layer is released by a wet etching process via the hollowed-out pattern 21, the wet etching solution will corrode the second electrode 3, which is also made of a metal material, via the hollowed-out pattern 21 located below the second electrode 3.

As an example of the present disclosure, when the acoustic transduction unit is used as a transmitter, an electric oscillating signal from an excitation power supply would cause a change of the electric field or the magnetic field in an electric energy storage element formed by the first electrode 1 and the second electrode 3 in the acoustic transduction unit, and the change will generate an impetus to the vibrating film 2 of the acoustic transduction unit to make it enter a vibrating state, thereby emitting the acoustic waves. When the acoustic transduction unit is used as a receiver, a process of receiving acoustic waves is opposite to the above process, and external acoustic waves act on the vibrating film 2 of the acoustic transduction unit, so that the vibrating film 2 vibrates, and this vibration causes corresponding changes of the electric field or the magnetic field in the electric energy storage element formed by the first electrode 1 and the second electrode 3 in the acoustic transduction unit, so that the first electrode 1 and the second electrode 3 of the acoustic transduction unit generate a voltage and a current which are corresponding to the acoustic waves. The first electrode 1 and the second electrode 3 are connected with a processor, and the processor could input electric signals to the first electrode 1 and the second electrode 3 or receive the electric signals output by the first electrode 1 and the second electrode 3, and process the electric signals to realize signal emission and reception of the acoustic transduction unit.

In the acoustic transduction unit, the hollowed-out pattern 21 is formed in the vibrating film 2, so that the vibration displacement of the vibrating film 2 under the same electric field or magnetic field formed by the first electrode 1 and the second electrode 3 is obviously increased relative to the vibration displacement of the vibrating film without the hollowed-out pattern. According to a rough estimation formula of a maximum emission sound pressure of the acoustic transduction unit, $P_{max}=2\pi f D_{max} Z f_a$ (Pmax is the maximum emission sound pressure; f is an operation frequency; $D_{max}$ is the maximum vibration displacement of the vibrating film 2; Z is an acoustic impedance of a medium; $f_a$ is a ratio of an average displacement of the vibrating film 2 to a maximum displacement at a center of the vibrating film 2, which is generally ⅕-⅓), the increased vibration displacement of the vibrating film 2 enables the emission sound pressure of the acoustic transduction unit to be increased remarkably, so that the emission sound pressure of the acoustic transduction unit is improved, the emission sound pressure is an important index parameter of the emission and reception sensing performance of the acoustic transduction unit, and the emission and reception sensing performance of the acoustic transduction unit is accordingly improved.

Figure 14:
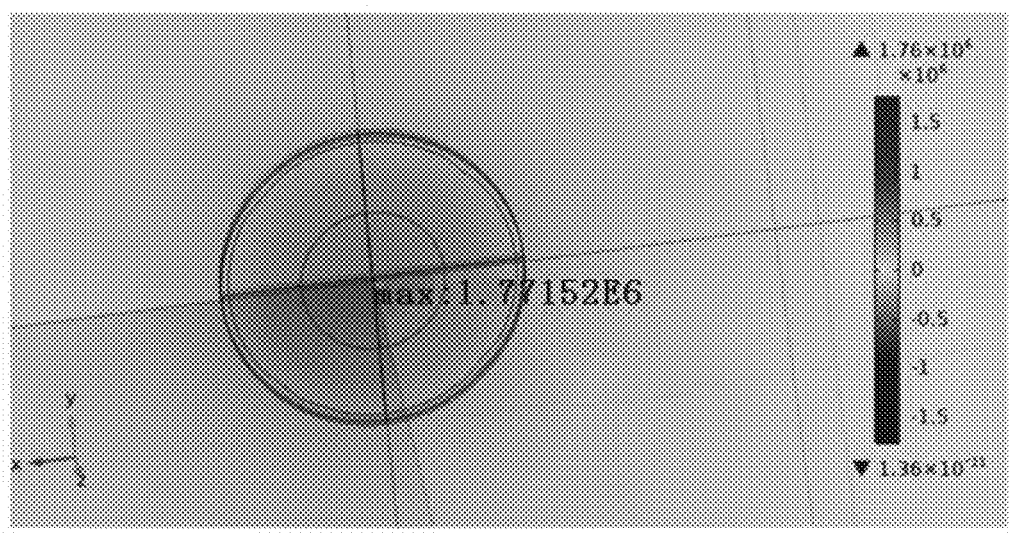
FIG. 14 is a schematic diagram illustrating a simulation result of an acoustic transduction unit with a conventional structure in the related art.
Figure 15:
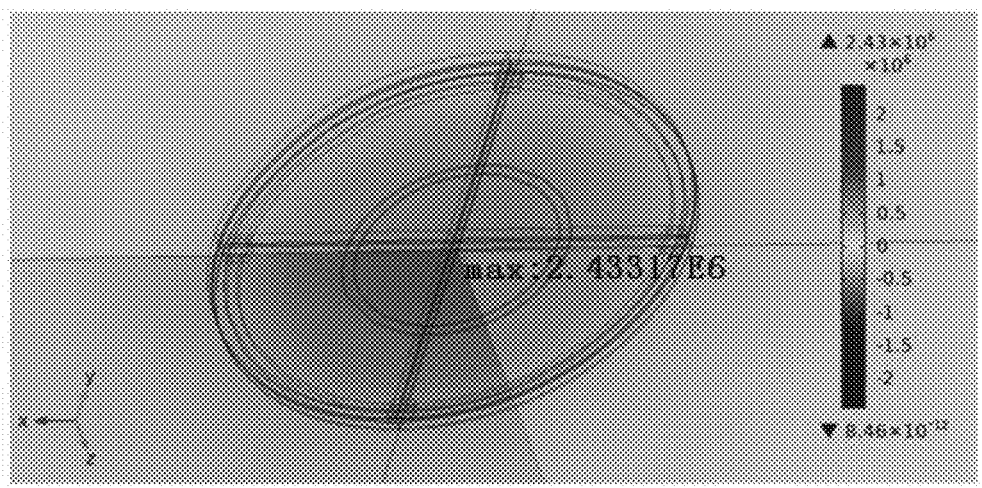
FIG. 15 is a schematic diagram illustrating a simulation result of an acoustic transduction unit according to the embodiment of the present application.

As an example, as shown in FIG. 14, the emission sound pressure of the acoustic transduction unit with the conventional structure is 1.76e6 Pa, and with the acoustic transduction unit of the present disclosure in which the vibrating film is provided with the hollowed-out pattern, the vibration displacement of the vibrating film is increased, and further the emission sound pressure of the acoustic transduction unit is significantly increased, as shown in FIG. 15. The emission sound pressure of the acoustic transduction unit of the present disclosure is 2.43e6 Pa, which is improved by 38% compared with the emission sound pressure with the conventional structure.

As an example of the present disclosure, a pattern of the hollowed-out pattern 21 includes a central symmetrical pattern, and an orthographic projection of a symmetry center of the central symmetrical pattern on the substrate coincides with a center of the first overlapping region 10.

As an example of the present disclosure, the hollowed-out pattern 21 includes a plurality of sub-portions 210, and orthographic projections of the plurality of sub-portions 210 on the substrate are uniformly arranged around the center of the first overlapping region 10; the sub-portions 210 includes an even number of sub-portions, and two sub-portions 210 of the even number of sub-portions located opposite to each other are symmetrically disposed by taking the center of the first overlapping region 10 as a symmetry center. The even number of the sub-portions 210 could improve uniformity of the vibrating film 2, thereby improving stability and quality of transmitting the acoustic wave signals by the acoustic transduction unit, and improving the stability and quality of receiving acoustic wave signals to be processed into electrical signals. The shapes of the plurality of sub-portions 210 include any one of polygonal shapes, arc shapes, arc shapes and rectangular shapes arranged at intervals, and non-closed arc shapes combined with rectangular shapes, as long as the hollowed-out pattern formed by the sub-portions 210 is a central symmetrical pattern.

As an example of the present disclosure, the sub-portions 210 may also include an odd number of sub-portions 210, which can also improve the uniformity of the vibrating film 2, thereby improving the stability and quality of transmitting the acoustic wave signals by the acoustic transduction unit and the stability and quality of receiving acoustic wave signals to be processed into electrical signals.

Figure 3:
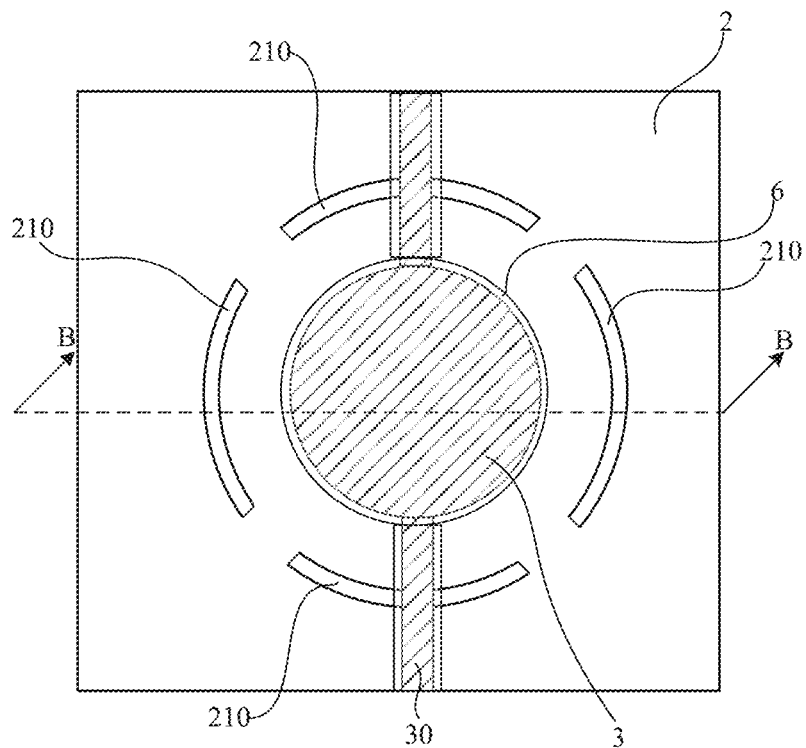
FIG. 3 is a schematic top view of a structure of an acoustic transduction unit according to an embodiment of the present disclosure.
Figure 4:
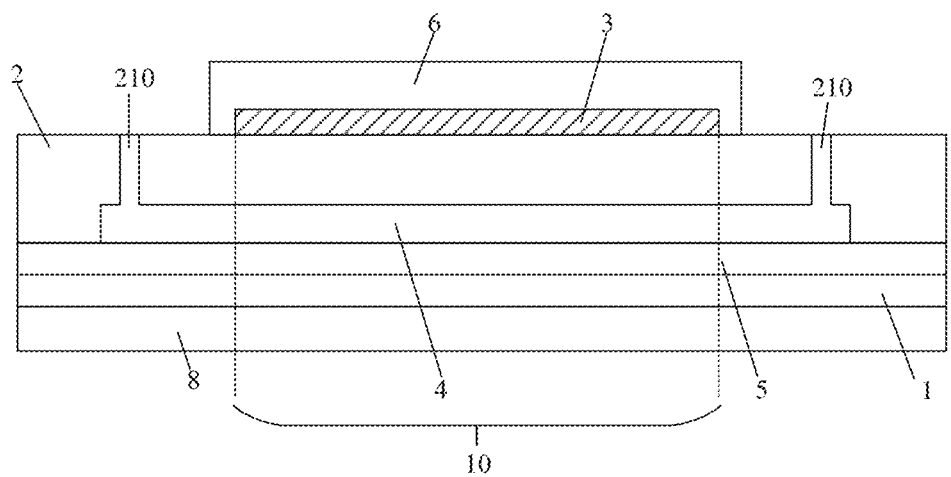
FIG. 4 is a schematic cross-sectional view of the structure of the acoustic transduction unit of FIG. 3 taken along a section line BB.
Figure 5:
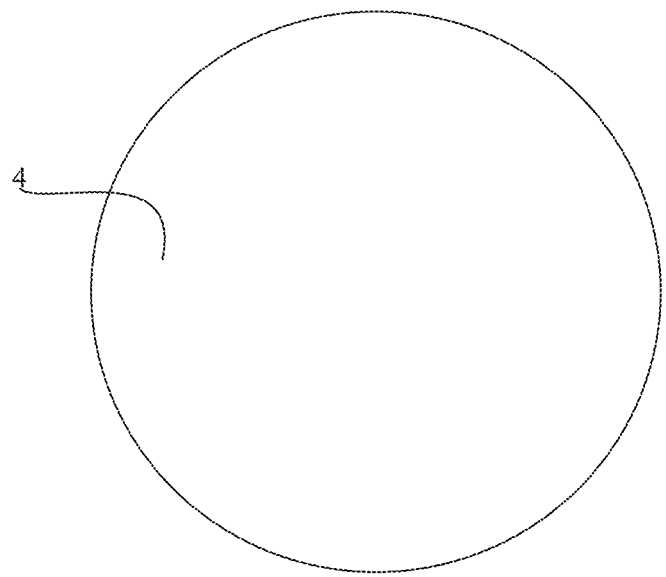
FIG. 5 is a schematic top view of a structure of a cavity in an acoustic transduction unit according to an embodiment of the present disclosure.
Figure 6:
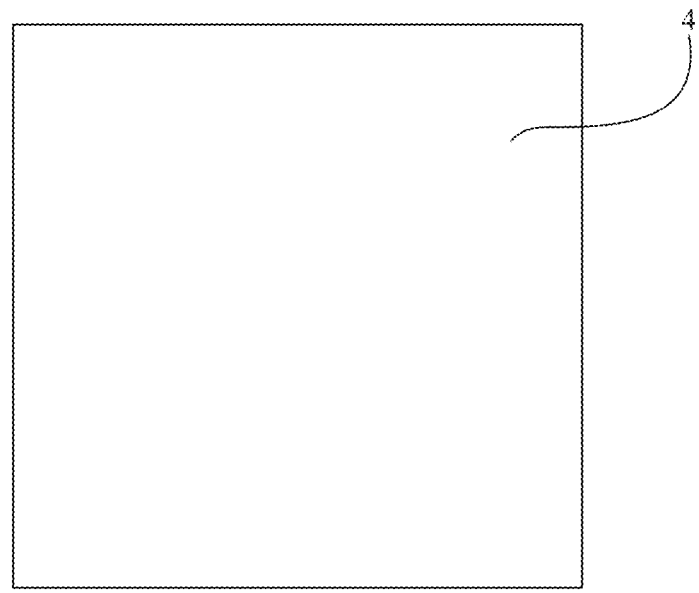
FIG. 6 is a schematic top view of a structure of a cavity in an acoustic transduction unit according to an embodiment of the present disclosure.

In this embodiment, as shown in FIG. 1 and FIG. 2, the hollowed-out pattern 21 includes two sub-portions 210, and the shape of each sub-portion 210 is a polygonal frame. As shown in FIGS. 3 and 4, the hollowed-out pattern 21 may include four sub-portions 210, and the shape of each sub-portion 210 is an arc. It should be noted that, when the shape of the sub-portion 210 is a polygonal frame, the shape of the corresponding cavity 4 is a square (as shown in FIG. 6), and when the shape of the sub-portion 210 is an arc, the shape of the corresponding cavity 4 is a circle (as shown in FIG. 5).

As an example of the present disclosure, the acoustic transduction unit further includes a corrosion barrier layer 5 and a passivation layer 6, the corrosion barrier layer 5 is disposed on one side of the first electrode 1 proximal to the vibrating film 2, and an orthographic projection of the corrosion barrier layer 5 on the substrate 8 covers the first electrode 1; the passivation layer 6 is disposed on a side of the second electrode 3 distal to the vibrating film 2, and an orthographic projection of the passivation layer 6 on the substrate 8 at least covers the second electrode 3. The corrosion barrier layer 5 could protect the first electrode 1 from being damaged when the cavity 4 between the first electrode 1 and the vibrating film 2 is formed, and the first electrode 1 is prevented from being corroded. The passivation layer 6 could protect the second electrode 3 from being exposed and damaged.

In this embodiment, the orthographic projection of the passivation layer 6 on the substrate 8 covers the second electrode 3 and a signal line 30 connected thereto. That is, the passivation layer 6 does not cover a region other than the second electrode 3 and the signal line 30 connected thereto.

As an example of the present disclosure, an orthographic projection of the passivation layer 6 on the substrate 8 and an orthographic projection of the hollowed-out pattern 21 on the substrate 8 do not overlap with each other, and the orthographic projection of the hollowed-out pattern 21 on the substrate 8 surrounds the orthographic projection of the passivation layer 6 on the substrate 8. That is, in this embodiment, the passivation layer 6 does not cover the hollowed-out pattern 21 in the vibrating film 2, and with this arrangement, on one hand, in the process of forming the cavity 4 after the passivation layer 6 is formed, the sacrificial layer for forming the cavity 4 may be released (i.e., removed by an etching process or removed by a development process) via the hollowed-out pattern 21, so as to form the cavity 4; on the other hand, the passivation layer 6 is not superposed on the hollowed-out pattern 21 of the vibrating film 2, so that the vibrating film 2 could vibrate freely under the electric field or the magnetic field formed by the first electrode 1 and the second electrode 3, and thus the maximum vibration displacement of the vibrating film 2 could be increased by a certain amount relative to the maximum vibration displacement of the vibrating film without the hollowed-out pattern, the emission sound pressure of the acoustic transduction unit of the present disclosure could be increased, and the sensing performance of transmission and reception of the acoustic transduction unit could be improved.

As an example of the present disclosure, the first electrode 1 and the second electrode 3 are made of any one of molybdenum, aluminum, copper and gold; of course, the first electrode 1 and the second electrode 3 are not limited to the above material as long as the material is a conductive metallic or non-metallic material. The vibrating film 2 is made of silicon nitride or silicon oxide. The corrosion barrier layer 5 is made of an inorganic insulating material such as silicon nitride or silicon oxide.

Of course, the corrosion barrier layer 5 may alternatively be made of an organic insulating material, such as polyimide, as long as the material and the preparation process have no conflict therebetween during the preparation process. The passivation layer 6 is made of an inorganic insulating material such as silicon nitride or silicon oxide. Of course, the passivation layer 6 may alternatively be made of an organic insulating material, such as polyimide, as long as the material and the preparation process have no conflict therebeween during the preparation process.

As an example of the present disclosure, the shape of the vibrating film 2 includes any one of rectangle, circle and regular polygon; of course, the vibrating film 2 is not limited to these regular shapes, and may be irregular. The shape of the first electrode 1 includes any one of rectangle, circle and regular polygon; of course, the first electrode 1 is not limited to these regular shapes, and may be irregular. The shape of the second electrode 3 includes any one of rectangle, circle and regular polygon. Of course, the second electrode 3 is not limited to these regular shapes, and may be irregular. The shape of each film layer refers to the shape of the orthographic projection of the film layer on the plane of the first electrode 1.

In this embodiment, the first electrode 1 is square, the vibrating film 2 is square, the second electrode 3 is circular or square, and correspondingly, the passivation layer 6 is circular or square. The shape of the cavity 4 is not particularly limited, and may be circular (as shown in FIG. 5), square (as shown in FIG. 6) or any other shape, and it should be noted that when the shape of the cavity is a circle, the shape of the corresponding sub-portion 210 is an arc, and when the shape of the cavity 4 is square, the shape of the corresponding sub-portion 210 is a polygonal frame.

The beneficial technical effects of the present disclosure are as below: the acoustic transduction unit is provided with the hollowed-out pattern in the vibrating film, the vibration displacement of the vibrating film under the same electric field or the magnetic field generated by the first electrode and the second electrode is obviously increased corresponding to the vibration displacement of the vibrating film without hollowed-out pattern, the increased vibration displacement of the vibrating film enables the obviously increased emission sound pressure of the acoustic transduction unit, thereby the emission sound pressure of the acoustic transduction unit is improved, the emission sound pressure is the important index parameter of the sensing performance of transmission and reception of the acoustic transduction unit, and then the sensing performance of transmission and reception of the acoustic transduction unit is promoted.

Based on the above structure of the acoustic transduction unit, an embodiment further provides a method for manufacturing the acoustic transduction unit, and in the method, the order of the steps in the method for manufacturing the acoustic transduction unit is not limited, and other orders of the steps in the method is within the protection scope of the present disclosure.

As an example of the present disclosure, the method for manufacturing the acoustic transduction unit includes the following steps S1 to S2:

Step S1: forming a first electrode on a substrate.

The substrate may be glass, silicon wafer, or the like. Forming a first electrode on a substrate may include depositing a metal conductive film layer, such as a metal film layer of molybdenum, aluminum, gold or copper, on the substrate; and then forming a pattern of the first electrode by performing a patterning process.

Step S2: sequentially forming a vibrating film and a second electrode on the first electrode such that a cavity is formed between the vibrating film and the first electrode.

As an example of the present disclosure, the method may further include step S3: stripping off the substrate.

It should be noted that, the method may not include the step of stripping off the substrate. That is, the substrate remains, and in this case, after step S2, the acoustic transduction unit is completed.

Figure 16:
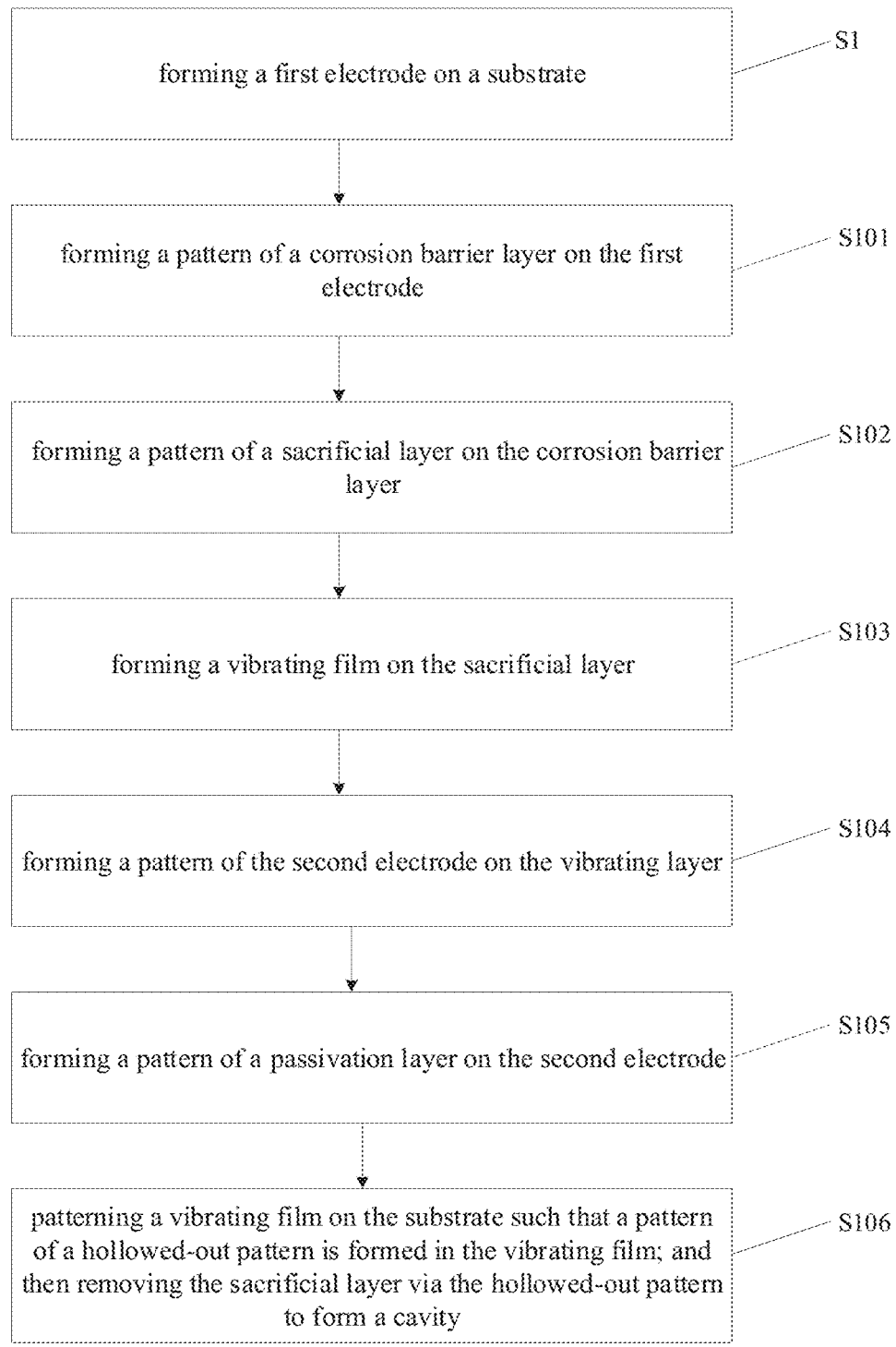
FIG. 16 is a flow chart showing a method for manufacturing an acoustic transduction unit according to an embodiment of the present application.

As an example of the present disclosure, step S2 particularly includes steps S101 to S106, as shown in FIG. 16:

Step S101: forming a pattern of a corrosion barrier layer on the substrate subjected to step S1, i.e., forming a pattern of a corrosion barrier layer on the first electrode.

In this step, a silicon nitride or silicon oxide film may be deposited, and then a pattern of the corrosion barrier layer is formed by a dry etching process.

Step S102: forming a pattern of a sacrificial layer on the substrate subjected to step S101, i.e., forming a pattern of a sacrificial layer on the corrosion barrier layer.

In this step, a metal film layer of aluminum, gold, silver, molybdenum, copper, or the like is deposited on the substrate subjected to step S101, and then the pattern of the sacrificial layer is formed by an exposure process and an etching process. Alternatively, an organic material film layer such as polyimide or photoresist may be formed on the substrate subjected to step S101, and then the pattern of the sacrificial layer is formed by an exposure process and a development process, and then an exposure process may be performed on the pattern of the sacrificial layer, so that the sacrificial layer is removed to form a cavity.

Step S103: forming a vibrating film on the substrate subjected to step S102, i.e., forming a vibrating film on the sacrificial layer.

In this step, a plasma enhanced chemical vapor deposition (PECVD) method is used to deposit a vibrating film of silicon nitride or silicon oxide.

Step S104: forming a pattern including a second electrode on the substrate subjected to S103, i.e., forming a pattern of the second electrode on the vibrating layer.

In this step, a metal conductive material film of aluminum, gold, copper, molybdenum, or the like is deposited on the substrate subjected to step S103, and then the pattern of the second electrode is formed by an exposure process and an etching process.

Step S105: forming a pattern including a passivation layer on the substrate subjected to step S104, i.e., forming a pattern of a passivation layer on the second electrode.

In this step, a film of silicon nitride or silicon oxide is formed on the substrate subjected to step S104 by using a plasma enhanced chemical vapor deposition method, and then the pattern of the passivation layer is formed by a dry etching process.

Step S106: patterning a vibrating film on the substrate subjected to step S105 such that a pattern of a hollowed-out pattern is formed in the vibrating film; and then removing the sacrificial layer via the hollowed-out pattern to form a cavity.

As an example of the present disclosure, the hollowed-out pattern is formed by punching the vibrating film, so that holes penetrate through the vibrating film to form the hollowed-out pattern, and the vibrating film is a vibrating film with the hollowed-out pattern; the orthographic projection of the hollowed-out pattern on the substrate is not overlapped with the orthographic projection of the second electrode on the substrate. Due to the arrangement, on one hand, it is easy to perform a subsequent formation of the cavity 4 via the hollowed-out pattern 21, and after the hollowed-out pattern 21 is formed, the sacrificial layer is released via the hollowed-out pattern 21, so that the cavity 4 is formed; on the other hand, the second electrode 3 is prevented from being corroded and damaged when the cavity 4 is formed; otherwise, if the sacrificial layer is made of a metal material, when the sacrificial layer is released by an wet etching process via the hollowed-out pattern 21, the wet etching solution will corrode the second electrode 3, which is also made of a metal material, via the hollowed-out pattern 21 located below the second electrode 3.

In the step, a dry etching process is used to form a vibrating film and a hollowed-out pattern in the vibrating film; and then the sacrificial layer is removed via the hollowed-out pattern by a wet etching process (as for the sacrificial layer made of a metal conductive material), or the sacrificial layer is removed via the hollowed-out pattern by a development process (as for the sacrificial layer made of an organic resin material such as polyimide or photoresist), and finally a cavity is formed between the corrosion barrier layer and the vibrating film.

In this embodiment, the corrosion barrier layer in step S101 could form a protection cover for the first electrode, so as to form the pattern of the sacrificial layer of the metal material on the corrosion barrier layer, and meanwhile, the formation of the corrosion barrier layer could prevent the wet etching solution from causing an etching damage on the first electrode in the process of patterning the vibrating film and removing the cavity when the sacrificial layer is made of the metal material.

Figure 7:
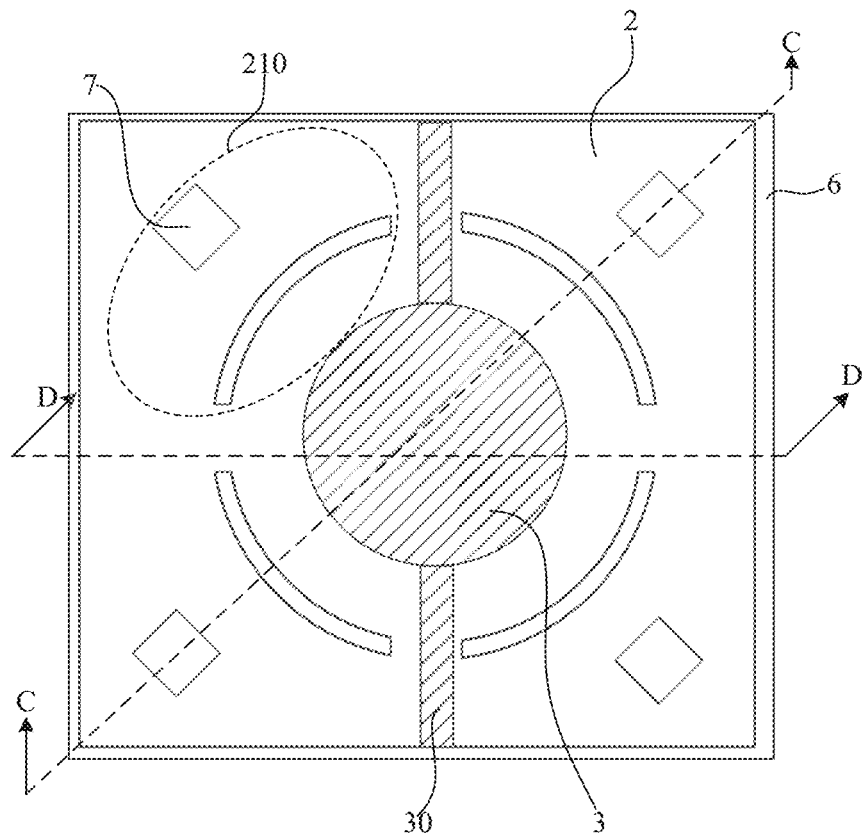
FIG. 7 is a schematic top view of a structure of an acoustic transduction unit according to an embodiment of the present disclosure.
Figure 8:
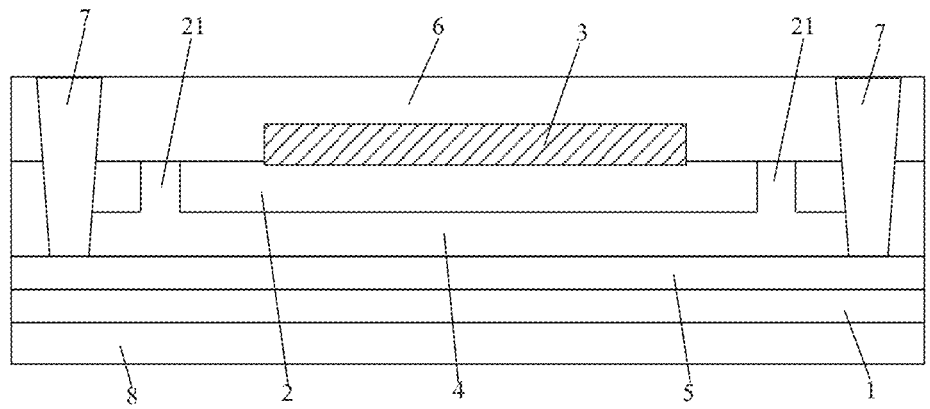
FIG. 8 is a schematic cross-sectional view of the structure of the acoustic transduction unit of FIG. 7 taken along a section line CC.
Figure 9:
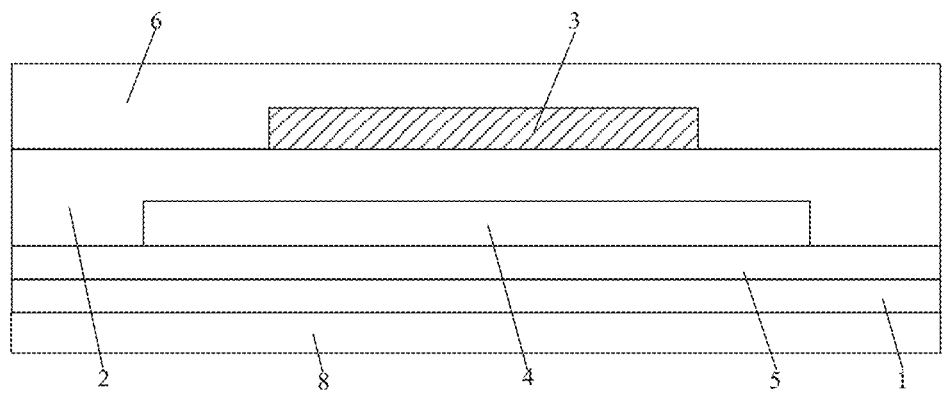
FIG. 9 is a schematic cross-sectional view of the structure of the acoustic transduction unit of FIG. 7 taken along a section line DD.

The present embodiment also provides an acoustic transduction unit, which is different from the above embodiments in that, as shown in FIGS. 7 to 9, an orthographic projection of a passivation layer 6 on a substrate 8 covers the cavity 4;

at least one through hole 7 is formed in the passivation layer 4, an orthographic projection of the through hole 7 on the substrate falls into an orthographic projection of the hollowed-out pattern 21 on the substrate 8, and meanwhile, an orthographic projection of the through hole 7 on the substrate falls into an orthographic projection of the cavity 4 on the substrate 8. In FIG. 7, a dotted line frame is a top view of one sub-portion 210 of the hollowed-out pattern 21, and a top view of the sub-portion 210 is a shape of an arc and a rectangular block spaced apart from each other.

In this embodiment, since the through hole 7 coincides with the rectangular block of the hollowed-out pattern 21, after penetrating through the passivation layer 6, the through hole 7 formed in the passivation layer 4 continues to pass through the rectangular block-shaped part of the hollowed-out pattern 21 of the vibrating film 2, and directly reaches the cavity 4, and an orthographic projection of the through hole 7 on the substrate should fall into an orthographic projection of the hollowed-out pattern 21 on the substrate 8, and should fall into an orthographic projection of the cavity 4 on the substrate 8. Since the passivation layer 6 covers the cavity 4 and the orthographic projection of the hollowed-out pattern 21 on the substrate 8 falls into the cavity 4, the passivation layer 6 covers the whole hollowed-out pattern 21, and the arrangement of the through hole 7 could remove the sacrificial layer formed between the corrosion barrier layer 5 and the vibrating film 2 and the sacrificial layer formed in the hollowed-out pattern 21 through the through hole 7 after the passivation layer 6 is formed, so as to form the cavity 4.

In this embodiment, the through hole 7 is filled with a hole filling material. The acoustic transduction unit could form a closed structure by filling the hole filing material in the through hole 7, so that external liquid (such as water and the like) is prevented from entering the inside of the acoustic transduction unit, and the acoustic transduction unit could normally work in the liquid (such as water and the like).

Figure 10:
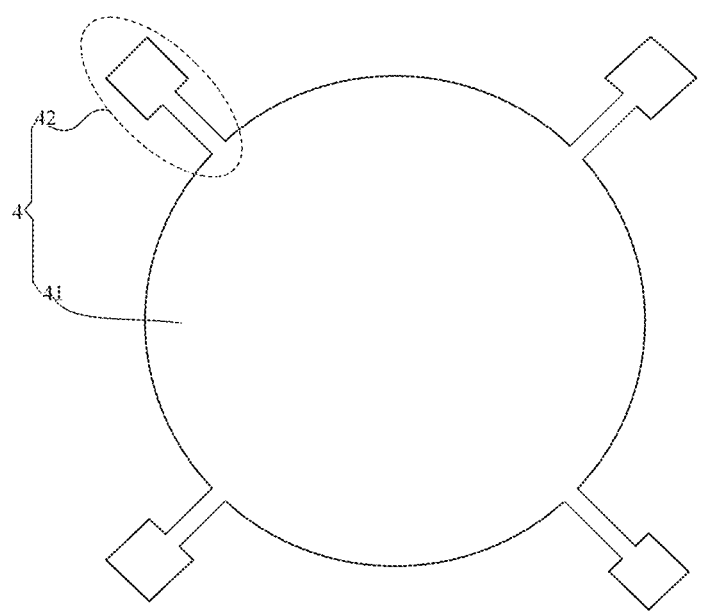
FIG. 10 is a schematic top view of a structure of a cavity of the acoustic transduction unit of FIG. 7.

As an example of the present disclosure, as shown in FIG. 10, the cavity 4 includes a cavity body 41, and an orthographic projection of the cavity body 41 on the substrate 8 includes a shape in any one of rectangle, circle, and regular polygon. In the present embodiment, the orthographic projection of the cavity body 41 is circular. In this embodiment, the cavity 4 further includes a plurality of cavity sub-bodies 42, the cavity sub-bodies 42 are disposed at intervals at a periphery of the cavity body 41, and the cavity sub-bodies 42 are communicated with the cavity body 41. In this embodiment, the cavity sub-bodies 42 include four cavity sub-bodies, and the orthographic projection of each cavity sub-body 42 on the substrate 8 is a shape of a rectangular strip combined with a rectangular block. That is, the rectangular block of a cavity sub-body 42 is connected to the cavity body 41 through the rectangular strip of the cavity sub-body 42. The number of the cavity sub-bodies could be set according to the actual requirements and is not limited herein. As shown in FIG. 10, a top view of one cavity sub-body 42 is shown in a dotted line frame. The cavity sub-bodies 42 are disposed at intervals at a periphery of the cavity body 41, that is, the cavity sub-bodies 42 are disposed at the periphery of the cavity body 41, the cavity body 41 is surrounded by the cavity sub-bodies 42, and two adjacent cavity sub-bodies 42 are spaced from each other.

Figure 11:
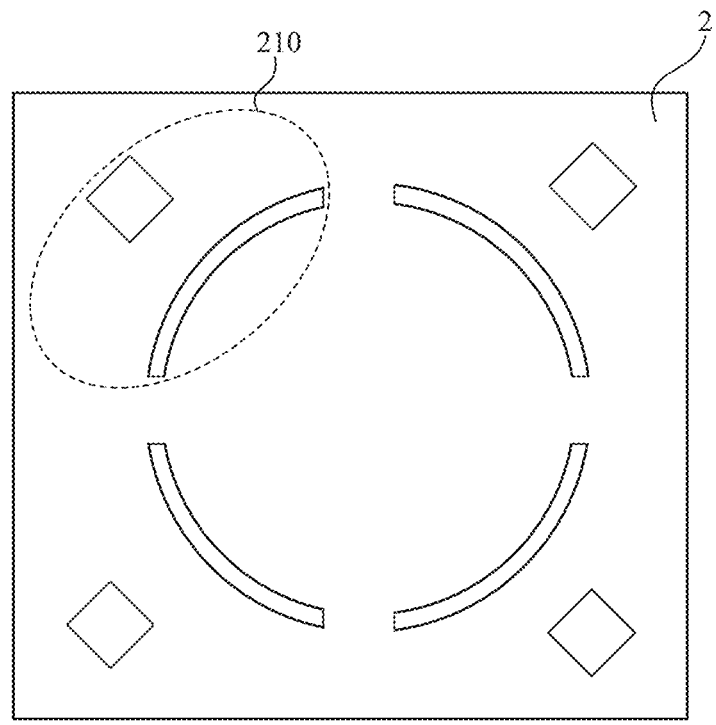
FIG. 11 is a schematic top view of a structure of a vibrating film of the acoustic transduction unit of FIG. 7.

As an example of the present disclosure, as shown in FIG. 11, inside the dotted line frame is a top view of one sub-portion 210; the sub-portion 210 of the hollowed-out pattern 21 of the vibrating film 2 has a shape of an arc and a rectangular block spaced apart from each other at an interval. And, four sub-portions 210 are provided, four through holes 7 are provided in the passivation layer 6, and orthographic projections of the four through holes 7 on the substrate 8 are respectively located in rectangular blocks in the orthographic projections of the sub-portions 210. As an example of the present disclosure, the orthographic projections of the four through holes 7 on the substrate 8 coincide with the rectangular blocks in the orthographic projections of the sub-portions 210, respectively. And the orthographic projections of the four through holes 7 on the substrate 8 are respectively located in rectangular blocks in the orthographic projections of the cavity sub-bodies 42. As an example of the present disclosure, the orthographic projections of the four through holes 7 on the substrate 8 are respectively overlapped with the rectangular blocks in the orthographic projections of the cavity sub-bodies 42 on the substrate 8.

Figure 12:
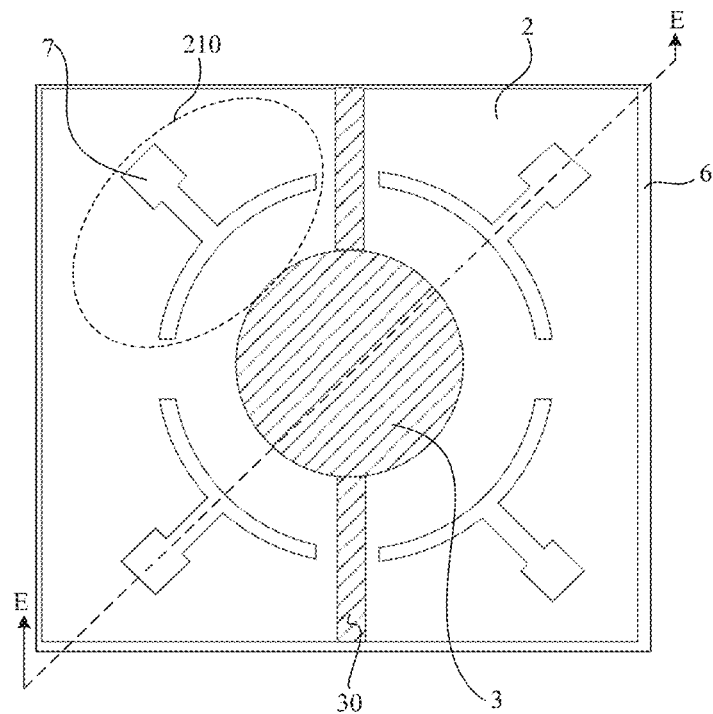
FIG. 12 is a schematic top view of a structure of an acoustic transduction unit according to an embodiment of the present disclosure.
Figure 13:
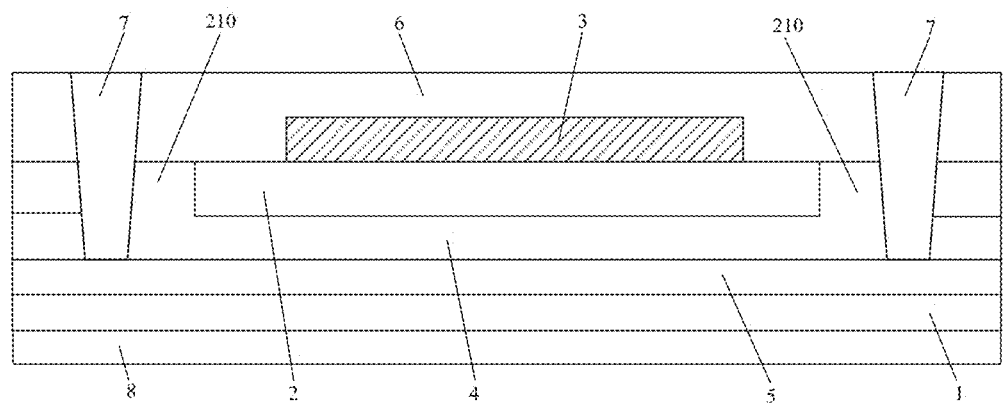
FIG. 13 is a schematic cross-sectional view of the structure of the acoustic transduction unit of FIG. 12 taken along a section line EE.

As an example of the present disclosure, unlike the sub-bodies 210 in FIG. 11, as shown in FIGS. 12 and 13, the shape of the sub-body 210 of the hollowed-out pattern 21 in the vibrating film 2 is a non-closed arc combined with a rectangular strip and a rectangular block.

Other structures of the acoustic transduction unit in the embodiment are the same as those in the above-described embodiments, and are not described herein again.

Figure 17:
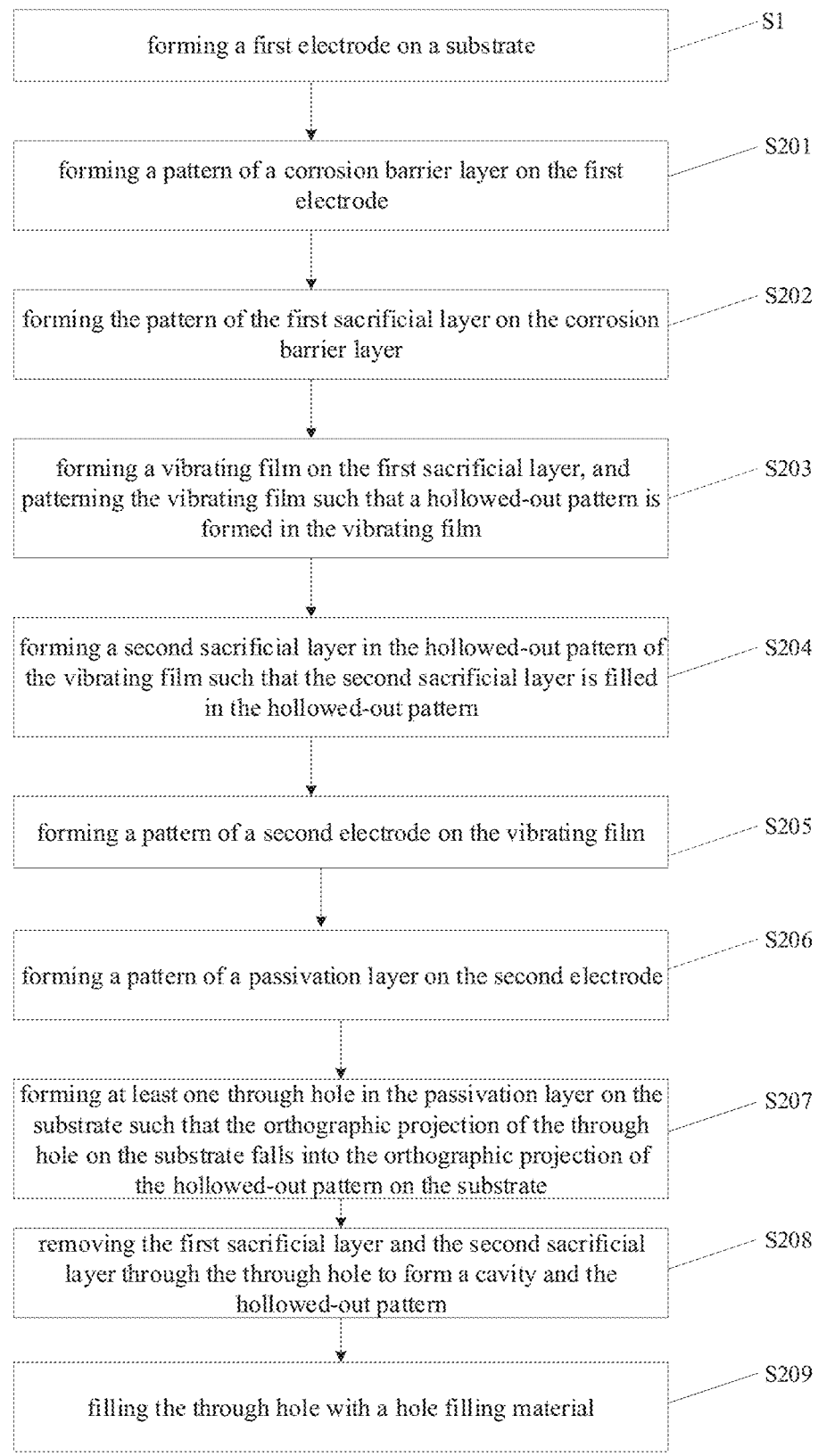
FIG. 17 is a flow chart showing a method for manufacturing an acoustic transduction unit according to an embodiment of the present application.

Based on the foregoing structure of the acoustic transduction unit, the embodiment further provides a method for manufacturing the acoustic transduction unit, and different from the method in the foregoing embodiment, step S2 of the method for manufacturing the acoustic transduction unit in this embodiment specifically includes, as shown in FIG. 17:

Step S201: forming a pattern of a corrosion barrier layer on the substrate subjected to step S1, i.e., forming a pattern of a corrosion barrier layer on the first electrode.

In this step, a film layer of silicon nitride or silicon oxide is formed, and then the pattern of the corrosion barrier layer is formed by a dry etching process.

Step S202: forming a pattern of a first sacrificial layer on the substrate subjected to step S201, i.e., forming the pattern of the first sacrificial layer on the corrosion barrier layer.

In this step, a metal film layer of aluminum, gold, silver, molybdenum, copper, or the like is deposited on the substrate subjected to step S201, and then the pattern of the first sacrificial layer is formed by an exposure process and an etching process. Alternatively, an organic material film layer such as polyimide or photoresist may be formed on the substrate subjected to step S201, and then the pattern of the first sacrificial layer is formed through an exposure process and a development process, and then an exposure process may be performed on the pattern of the sacrificial layer, so that the first sacrificial layer is removed to form the cavity.

Step S203: forming a vibrating film on the substrate subjected to step S202, i.e., forming a vibrating film on the first sacrificial layer, and patterning the vibrating film such that a hollowed-out pattern is formed in the vibrating film.

In the step, a plasma enhanced chemical vapor deposition (PECVD) method is used to form a vibrating film of silicon nitride or silicon oxide; and then the hollowed-out pattern in the vibrating film is formed by a dry etching process.

Step S204: forming a pattern of a second sacrificial layer on the substrate after step S203, i.e., forming the second sacrificial layer in the hollowed-out pattern of the vibrating film such that the second sacrificial layer is filled in the hollowed-out pattern.

In this step, a metal film layer of aluminum, gold, silver, molybdenum, copper, or the like is deposited on the substrate after step S203, and then a pattern of the second sacrificial layer is formed by an exposure process and an etching process. Alternatively, an organic material film layer such as polyimide or photoresist may be coated on the substrate subjected to step S203, then a pattern of the second sacrificial layer is formed by an exposure process and a development process, and then an exposure process should be performed on the pattern of the second sacrificial layer, so that the second sacrificial layer is removed to form the hollowed-out pattern in the vibrating film.

The reason for forming the second sacrificial layer in the hollowed-out pattern in the vibrating film is as follows: if the hollowed-out pattern in the vibrating film is not filled with the second sacrificial layer, the hollowed-out pattern may be filled by the passivation layer prepared subsequently, and the hollowed-out pattern could not be formed. That is, the hollowed-out pattern in the vibrating film is first filled with the second sacrificial layer, and then the second sacrificial layer is released to form the hollowed-out pattern.

Step S205: forming a pattern of a second electrode on the substrate subjected to step S204, i.e., forming a pattern of a second electrode on the vibrating film.

In this step, a metal conductive material film of aluminum, gold, copper, molybdenum, or the like is deposited on the substrate subjected to step S204, and then the pattern of the second electrode is formed by an exposure process and an etching process.

Step S206: forming a pattern of a passivation layer on the substrate subjected to step S205, i.e., forming a pattern of a passivation layer on the second electrode.

In this step, a film layer of silicon nitride or silicon oxide material is formed on the substrate subjected to step S205 by a plasma enhanced chemical vapor deposition method, and then the pattern of the passivation layer is formed by a dry etching process.

Step S207: forming at least one through hole in the passivation layer on the substrate subjected to step S206; the orthographic projection of the through hole on the substrate falls into the orthographic projection of the hollowed-out pattern on the substrate.

In the step, a through hole is formed in the passivation layer by a dry etching process, and the orthographic projection of the through hole on the substrate falls into the orthographic projection of the hollowed-out pattern on the substrate. That is, the position of the through hole coincides with the position of the sub-portions of the hollowed-out pattern, so that the through hole formed in the passivation layer continuously penetrates through the hollowed-out pattern of the vibrating film after penetrating through the passivation layer, and directly reaches the first sacrificial layer, and the orthographic projection of the through hole on the substrate not only falls into the orthographic projection of the hollowed-out pattern on the substrate, but also falls into the orthographic projection of the first sacrificial layer on the substrate.

Step S208: removing the first sacrificial layer and the second sacrificial layer through the through hole to form a cavity and the hollowed-out pattern.

In the step, a wet etching process (as for the first sacrificial layer and the second sacrificial layer of the metal conductive material) is used to remove the first sacrificial layer and the second sacrificial layer through the through hole, or a development process (as for the first sacrificial layer and the second sacrificial layer of an organic resin material such as polyimide or photoresist) is used to remove the first sacrificial layer and the second sacrificial layer through the through hole, so that a cavity between the corrosion barrier layer and the vibrating film, and a hollowed-out pattern in the vibrating film are formed.

Step S209: filling the through hole with a hole filling material.

In this step, amorphous silicon or a metal material such as aluminum is deposited to fill the through hole. The hole filling material fills the through hole.

Other steps of the method for manufacturing the acoustic transduction unit in this embodiment are the same as those in the above embodiments, and are not described herein again.

In the acoustic transduction unit according to the embodiment, with the hollowed-out pattern in the vibrating film, the vibration displacement of the vibrating film under the same electric field or magnetic field formed by the first electrode and second electrode is obviously increased compared with the vibration displacement of the vibrating film without the hollowed-out pattern, and the increase of the vibration displacement of the vibrating film enables the increase of the emission sound pressure of the acoustic transduction unit, thereby the emission sound pressure of the acoustic transduction unit has been improved, the emission sound pressure is the important index parameter of the emission and reception sensing performance of the acoustic transduction unit, and then the emission and reception sensing performance of the acoustic transduction unit has been promoted.

The embodiment of the present disclosure further provides an acoustic transducer, which includes a plurality of acoustic transduction units in any one of the above embodiments.

With the plurality of acoustic transduction units, the acoustic transducer that the present disclosure provides, could improve the emission sound pressure of the acoustic transducer, and promote the emission and reception sensing performance of the acoustic transducer.

It will be understood that, the above embodiments are merely exemplary embodiments employed to illustrate the principles of the present disclosure, and the present disclosure is not limited thereto. It will be apparent to a person skilled in the art that various changes and modifications could be made therein without departing from the spirit and scope of the disclosure, and these changes and modifications are to be considered within the scope of the disclosure.

What is claimed is:

1. An acoustic transduction unit, comprising: a substrate, a first electrode, a vibrating film and a second electrode sequentially arranged on the substrate, and a cavity formed between the first electrode and the vibrating film, wherein
   orthographic projections of the first electrode, the cavity, the vibrating film and the second electrode on the substrate are at least partially overlapped with each other at a first overlapping region, and a hollowed-out pattern is formed in the vibrating film, and
   an orthographic projection of the hollowed-out pattern on the substrate and the orthographic projection of the cavity on the substrate are overlapped with each other and the hollowed-out pattern is distributed in a discontinuous manner around the first overlapping region.

2. The acoustic transduction unit of claim 1, wherein the hollowed-out pattern comprises a central symmetric pattern, and an orthographic projection of a symmetry center of the central symmetric pattern on the substrate coincides with a center of the first overlapping region.

3. The acoustic transduction unit of claim 2, wherein the hollowed-out pattern comprise a plurality of sub-portions, orthographic projections of which on the substrate are uniformly arranged around the center of the first overlapping region; the plurality of sub-portions comprise even number of sub-portions, two opposite sub-portions of which are symmetrically arranged by taking the center of the first overlapping region as a symmetrical center, and the plurality of sub-portions each comprise any one of a polygon, an arc, an arc and a rectangle arranged at intervals, and a non-closed arc combined with a rectangular strip and/or a rectangular block.

4. The acoustic transduction unit of claim 1, wherein the cavity comprises a cavity body, and an orthographic projection of the cavity body on the substrate has a shape which comprises any one of a rectangle, a circle, and a regular polygon.

5. The acoustic transduction unit of claim 4, wherein the cavity further comprises a plurality of cavity sub-bodies, the plurality of cavity sub-bodies are arranged at intervals at a periphery of the cavity body, and the cavity sub-bodies are communicated with the cavity body; and the orthographic projection of the hollowed-out pattern on the substrate falls into the orthographic projection of the cavity on the substrate; and the orthographic projection of the hollowed-out pattern on the substrate is not overlapped with the orthographic projection of the second electrode on the substrate.

6. The acoustic transduction unit of claim 1, further comprising a corrosion barrier layer and a passivation layer, wherein the corrosion barrier layer is disposed on a side of the first electrode proximal to the vibrating film, and an orthographic projection of the corrosion barrier layer on the substrate covers the orthographic projection of the first electrode on the substrate; and the passivation layer is arranged on a side of the second electrode distal to the vibrating film, and an orthographic projection of the passivation layer on the substrate at least covers the orthographic projection of the second electrode on the substrate.

7. The acoustic transduction unit of claim 6, wherein the orthographic projection of the passivation layer on the substrate and the orthographic projection of the hollowed-out pattern on the substrate are not overlapped with each other.

8. The acoustic transduction unit of claim 6, wherein the orthographic projection of the passivation layer on the substrate covers the orthographic projection of the cavity on the substrate; and at least one through hole is formed in the passivation layer, and an orthographic projection of the at least one through hole on the substrate falls into the orthographic projection of the hollowed-out pattern on the substrate.

9. The acoustic transduction unit of claim 8, wherein the at least one through hole is filled with a hole filling material.

10. The acoustic transduction unit of claim 1, wherein the first electrode and the second electrode are made of any one of molybdenum, aluminum, copper and gold;

the vibrating film is made of silicon nitride and/or silicon oxide;

a shape of the vibrating film comprises any one of a rectangle, a circle and a regular polygon;

a shape of the first electrode comprises any one of a rectangle, a circle and a regular polygon; and a shape of the second electrode includes any one of a rectangle, a circle, and a regular polygon.

11. An acoustic transducer, comprising at least one acoustic transduction unit according to claim 1.

12. A method for manufacturing an acoustic transduction unit, comprising:

forming a first electrode on a substrate; and sequentially forming a vibrating film and a second electrode on the first electrode such that a cavity is formed between the vibrating film and the first electrode, and the orthographic projections of the first electrode, the cavity, the vibrating film and the second electrode on the substrate are at least partially overlapped with each other at a first overlapping region, a hollowed-out pattern is formed in the vibrating film, and orthographic projections of the hollowed-out pattern and the cavity on the substrate are overlapped with each other, and the hollowed-out pattern is distributed in a discontinuous manner around the first overlapping region.

13. The method of claim 12, wherein the sequentially forming a vibrating film and a second electrode on the first electrode comprises:

forming a pattern of a corrosion barrier layer on the first electrode;

forming a pattern of a sacrificial layer on the corrosion barrier layer;

forming the vibrating film on the sacrificial layer;

forming a pattern of the second electrode on the vibrating film;

forming a pattern of a passivation layer on the second electrode; and patterning the vibrating film such that the hollowed-out pattern is formed in the vibrating film; then removing the sacrificial layer via the hollowed-out pattern to form the cavity such that the orthographic projection of the passivation layer on the substrate is not overlapped with the orthographic projection of the hollowed-out pattern on the substrate.

14. The method of claim 12, wherein the sequentially forming a vibrating film and a second electrode on the first electrode comprises:

forming a pattern of a corrosion barrier layer on the first electrode;

forming a pattern of a first sacrificial layer on the corrosion barrier layer;

forming a vibrating film on the first sacrificial layer, and patterning the vibrating film such that a pattern of the hollowed-out pattern is formed in the vibrating film;

forming a pattern of a second sacrificial layer in the hollowed-out pattern of the vibrating film such that the second sacrificial layer is filled in the hollowed-out pattern;

forming a pattern of the second electrode on the vibrating film;

forming a pattern of a passivation layer on the second electrode;

forming at least one through hole in the passivation layer such that an orthographic projection of the at least one through hole on the substrate falls into the orthographic projection of the hollowed-out pattern on the substrate;

removing the first sacrificial layer and the second sacrificial layer via the at least one through hole to form the cavity and the hollowed-out pattern such that an orthographic projection of the passivation layer on the substrate covers an orthographic projection of the cavity on the substrate; and filling the at least one through hole with a hole filling material.

15. The method of claim 12, wherein the hollowed-out pattern comprises a central symmetric pattern, and an orthographic projection of a symmetry center of the central symmetric pattern on the substrate coincides with a center of the first overlapping region.

16. The method of claim 15, wherein the hollowed-out pattern comprises a plurality of sub-portions, orthographic projections of which on the substrate are uniformly arranged around the center of the first overlapping region; the plurality of sub-portions comprise even number of sub-portions, two opposite sub-portions of which are symmetrically arranged by taking the center of the first overlapping region as a symmetrical center, and the plurality of sub-portions each comprise any one of a polygon, an arc, an arc and a rectangle arranged at intervals, and a non-closed arc combined with a rectangular strip and/or a rectangular block.

17. The method of claim 12, wherein the cavity comprises a cavity body, and an orthographic projection of the cavity body on the substrate has a shape which comprises any one of a rectangle, a circle, and a regular polygon.

18. The method of claim 17, wherein the cavity further comprises a plurality of cavity sub-bodies, the plurality of cavity sub-bodies are arranged at intervals at a periphery of the cavity body, and the cavity sub-bodies are communicated with the cavity body; and the orthographic projection of the hollowed-out pattern on the substrate falls into the orthographic projection of the cavity on the substrate; and the orthographic projection of the hollowed-out pattern on the substrate is not overlapped with the orthographic projection of the second electrode on the substrate.

19. The method of claim 12, wherein the first electrode and the second electrode are made of any one of molybdenum, aluminum, copper and gold;

the vibrating film is made of silicon nitride and/or silicon oxide;

a shape of the vibrating film comprises any one of a rectangle, a circle and a regular polygon;

a shape of the first electrode comprises any one of a rectangle, a circle and a regular polygon; and a shape of the second electrode includes any one of a rectangle, a circle, and a regular polygon.

* * * * *